(12) United States Patent
Raghavan et al.

(10) Patent No.: US 8,170,819 B2
(45) Date of Patent: May 1, 2012

(54) SYSTEMS AND METHODS FOR MEASURING NON-LINEAR CHARACTERISTICS OF A POWER AMPLIFIER

(75) Inventors: Revathi Sundara Raghavan, San Diego, CA (US); Puay Hoe See, San Diego, CA (US); Rema Vaidyanathan, San Diego, CA (US); Richard M. Schierbeck, II, San Diego, CA (US); Sudarsan Krishnan, San Diego, CA (US); Zae Yong Choi, San Jose, CA (US)

(73) Assignee: QUALCOMM, Incorporated, San Diego, CA (US)

( * ) Notice: Subject to any disclaimer, the term of this patent is extended or adjusted under 35 U.S.C. 154(b) by 427 days.

(21) Appl. No.: 12/108,302

(22) Filed: Apr. 23, 2008

(65) Prior Publication Data

US 2009/0138226 A1 May 28, 2009

Related U.S. Application Data

(60) Provisional application No. 60/914,264, filed on Apr. 26, 2007.

(51) Int. Cl.
*G01R 13/00* (2006.01)
*G01R 23/00* (2006.01)
*H04B 1/04* (2006.01)

(52) U.S. Cl. .............. 702/66; 455/114.3; 324/76.12

(58) Field of Classification Search ............ 702/66, 702/73, 107; 324/76.19, 76.21, 76.23, 76.12; 455/114.3, 424
See application file for complete search history.

(56) References Cited

U.S. PATENT DOCUMENTS

| 5,949,283 | A | * | 9/1999 | Proctor et al. ............... 330/149 |
| 6,211,663 | B1 | * | 4/2001 | Moulthrop et al. ......... 324/76.23 |
| 7,071,777 | B2 | | 7/2006 | McBeath et al. |
| 2006/0071711 | A1 | | 4/2006 | Persson et al. |
| 2006/0242392 | A1 | | 10/2006 | Elwood |

OTHER PUBLICATIONS

International Search Report and Written Opinion—PCT/US2008/061385, International Search Authority—European Patent Office—Apr. 11, 2008.
Partial International Search Report—PCT/US2008/061385, International Search Authority European Patent Office—Jun. 26, 2008.

* cited by examiner

*Primary Examiner* — Bryan Bui
(74) *Attorney, Agent, or Firm* — William M. Hooks

(57) ABSTRACT

A method for measuring non-linear characteristics of a power amplifier is described. A calibration waveform is calculated during a testing procedure period. Amplitude characteristics of the calibration waveform at the output of the power amplifier are measured during the testing procedure period. Phase characteristics of the calibration waveform at the output of the power amplifier are measured during the testing procedure period. Pre-distortion techniques are configured based on the amplitude characteristics and the phase characteristics to be used during a normal operation period of a transmitter.

26 Claims, 11 Drawing Sheets

SYSTEMS AND METHODS FOR MEASURING NON-LINEAR CHARACTERISTICS OF A POWER AMPLIFIER

RELATED APPLICATIONS

This application is related to and claims priority from U.S. Provisional patent application Ser. No. 60/914,264 filed Apr. 26, 2007, for METHOD AND APPARATUS FOR POWER AMPLIFIER OPERATION, with inventors Revathi Sundara Raghavan, Richard Schierbeck II, Sudarsan Krishnan, Zae Yong Choi, Puay Hoe See and Rema Vaidyanathan, which is incorporated herein by reference.

TECHNICAL FIELD

The present disclosure relates generally to wireless communication systems. More specifically, the present disclosure relates to systems and methods for measuring non-linear characteristics of a power amplifier.

BACKGROUND

Wireless communication devices have become smaller and more powerful in order to meet consumer needs and to improve portability and convenience. Consumers have become dependent upon wireless communication devices such as cellular telephones, personal digital assistants (PDAs), laptop computers, and the like. Consumers have come to expect reliable service, expanded areas of coverage, and increased functionality. Wireless communication devices may be referred to as mobile stations, stations, access terminals, user terminals, terminals, subscriber units, user equipment, etc.

A wireless communication system may simultaneously support communication for multiple wireless communication devices. A wireless communication device may communicate with one or more base stations (which may alternatively be referred to as access points, Node Bs, etc.) via transmissions on the uplink and the downlink. The uplink (or reverse link) refers to the communication link from the wireless communication devices to the base stations, and the downlink (or forward link) refers to the communication link from the base stations to the wireless communication devices.

Wireless communication systems may be multiple-access systems capable of supporting communication with multiple users by sharing the available system resources (e.g., bandwidth and transmit power). Examples of such multiple-access systems include code division multiple access (CDMA) systems, time division multiple access (TDMA) systems, frequency division multiple access (FDMA) systems wideband code division multiple access (WCDMA), global system for mobile (GSM) communication systems, enhanced data rates for GSM evolution (EDGE) systems, and orthogonal frequency division multiple access (OFDMA) systems.

DETAILED DESCRIPTION

Figure 1:
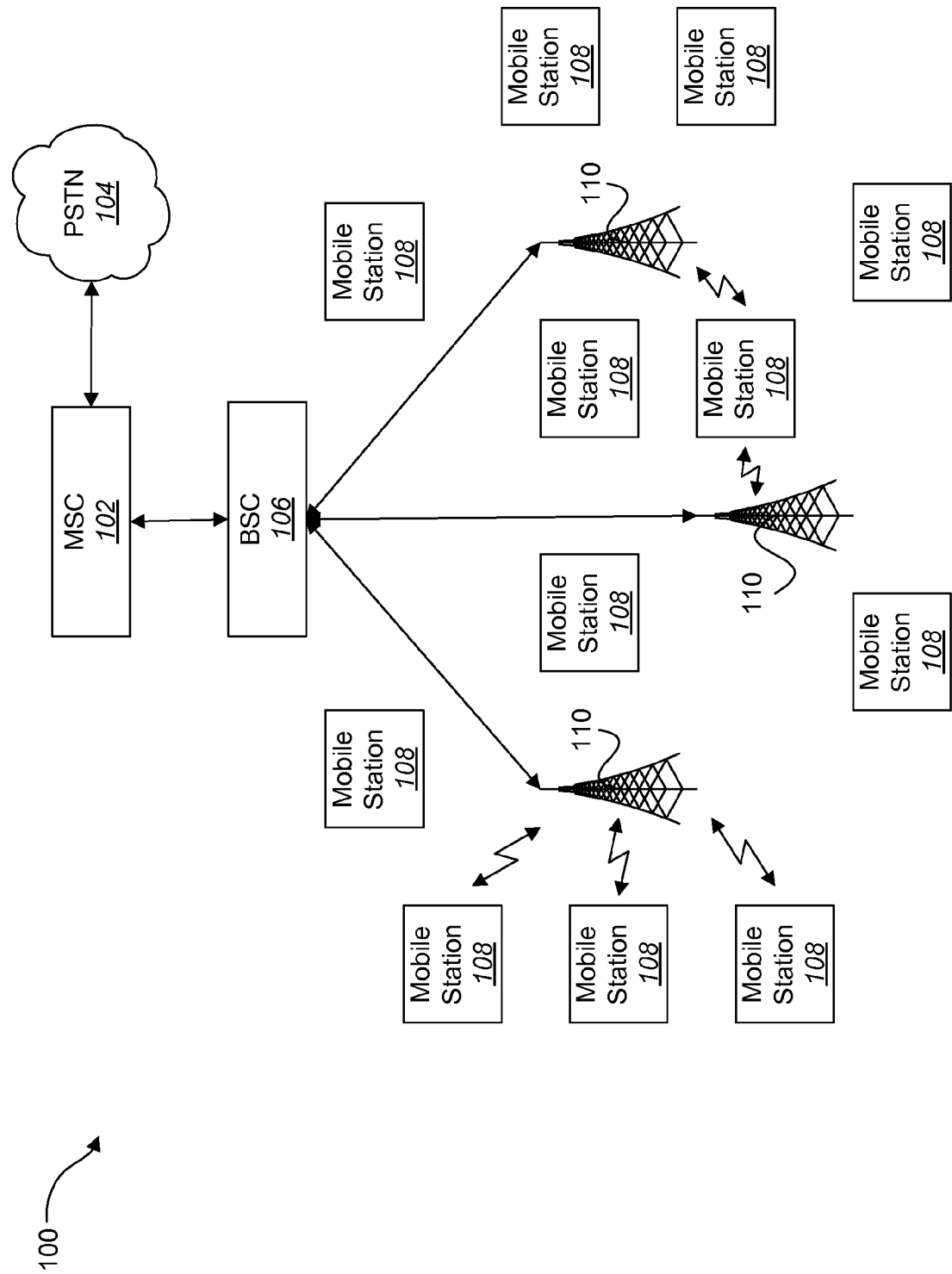
FIG. 1 illustrates one configuration of a wireless system that may be used with the present systems and methods.

Amplifiers may have a linear range and a nonlinear range. To avoid signal distortion, amplifiers may be used in their linear range. In the nonlinear range, the signals may be subject to amplitude to amplitude modulation and amplitude to phase modulation. This may be caused by the fact that as the amplifier is operated in the nonlinear range, the ratio of input to output power may not be constant. As the input signal amplitude increases, a disproportionate increase in the output power may be manifested. This may be referred to as amplitude modulation to amplitude modulation (AMAM) since an unwanted additional amplitude modulation is experienced. AMAM may be experienced up to a maximum output power at which point the input values may have the same output value. This may be called compression and may result in the signal being clipped. The signal may have square or sharp edges in the time domain which implies that higher frequency components may be generated. This may cause out of band emissions in addition to distortion of the amplified signal.

In addition to the amplitude distortion discussed above, the output phase of the signal may not be constant at different levels of the amplitudes of the input signal that is being amplified. The amplified signal may experience a phase modulation as a function of the input amplitude and this relationship may not be constant (i.e., the relationship is nonlinear). This may be referred to as amplitude modulation to phase modulation (AMPM).

The present systems and methods enable a power amplifier (PA) to be driven harder in order to obtain more efficiency from the PA. Typically, operating a PA at a higher efficiency may come at the cost of amplitude and phase distortion of the input signal. Pre-distortion techniques may be used to correct these distortions. However, the PA may have a memory effect which means that the actual distortion observed depends on the nature of the waveform to be transmitted (i.e., the transmit waveform). In other words AMAM/AMPM characteristics of the PA may be dependent on the nature of the waveform of the input signal. The present systems and methods measure the mean AMAM/AMPM characteristics of the PA when a transmitter is transmitting a waveform that is similar to the actual transmit waveform. The testing of the PA may be done during the manufacturing or assembly of the transmitter that includes the PA. The PA may amplify signals for Global System for Mobile (GSM) communication systems, Enhanced Data Rates for GSM Evolution (EDGE) systems, Wideband Code Division Multiple Access (WCDMA) systems, etc.

The measured mean AMAM/AMPM characteristics of the PA may be used to pre-distort the transmit waveform. In addition, the PA may be calibrated using the actual transmit signal, which may enable pre-distortion techniques to be implemented for various types of communication systems (e.g., GSM, EDGE, WCDMA, etc.) Typically, the specifications for PAs implemented in each type of communication system are different. For example, a PA used in a GSM system may be different than a PA used in a WCDMA system. However, by using the actual transmit signal to calibrate the PA, the same PA may be used for each type of communication system.

A method for measuring non-linear characteristics of a power amplifier is described. A calibration waveform is calculated during a testing procedure period. Amplitude characteristics of the calibration waveform at the output of the power amplifier are measured during the testing procedure period. Phase characteristics of the calibration waveform at the output of the power amplifier are measured during the testing procedure period. Pre-distortion techniques are configured based on the amplitude characteristics and the phase characteristics to be used during a normal operation period of a transmitter.

An apparatus for measuring non-linear characteristics of a power amplifier is also described. The apparatus includes a processor and memory in electronic communication with the processor. Instructions are stored in the memory. The instructions are executable to calculate a calibration waveform during a testing procedure period, and measure amplitude characteristics of the calibration waveform at the output of the power amplifier during the testing procedure period. In addition, the instructions are further executable to measure phase characteristics of the calibration waveform at the output of the power amplifier during the testing procedure period, and configure pre-distortion techniques based on the amplitude characteristics and the phase characteristics to be used during a normal operation period.

The apparatus for measuring non-linear characteristics of a power amplifier also includes means for calculating a calibration waveform during a testing procedure period, and means for measuring amplitude characteristics of the calibration waveform at the output of the power amplifier during the testing procedure period. The apparatus further includes means for measuring phase characteristics of the calibration waveform at the output of the power amplifier during the testing procedure period, and means for configuring pre-distortion techniques based on the amplitude characteristics and the phase characteristics to be used during a normal operation period.

A computer-program product for measuring non-linear characteristics of a power amplifier is also described. The computer-program product includes a computer readable medium having instructions thereon. The instructions include code for calculating a calibration waveform during a testing procedure period, and code for measuring amplitude characteristics of the calibration waveform at the output of the power amplifier during the testing procedure period. The instructions further include code for measuring phase characteristics of the calibration waveform at the output of the power amplifier during the testing procedure period, and code for configuring pre-distortion techniques based on the amplitude characteristics and the phase characteristics to be used during a normal operation period.

FIG. 1 illustrates a wireless system 100 that may include a plurality of mobile stations 108, a plurality of base stations 110, a base station controller (BSC) 106 and a mobile switching center (MSC) 102. The system 100 may be GSM, EDGE, WCDMA, CDMA, etc. The MSC 102 may be configured to interface with a public switch telephone network (PSTN) 104. The MSC 102 may also be configured to interface with the BSC 106. There may be more than one BSC 106 in the system 100. Each base station 110 may include at least one sector (not shown), where each sector may have an omnidirectional antenna or an antenna pointed in a particular direction radially away from the base stations 110. Alternatively, each sector may include two antennas for diversity reception. Each base station 110 may be designed to support a plurality of frequency assignments. The intersection of a sector and a frequency assignment may be referred to as a channel. The mobile stations 108 may include cellular or portable communication system (PCS) telephones.

During operation of the cellular telephone system 100, the base stations 110 may receive sets of reverse link signals from sets of mobile stations 108. The mobile stations 108 may be involved in telephone calls or other communications. Each reverse link signal received by a given base station 110 may be processed within that base station 110. The resulting data may be forwarded to the BSC 106. The BSC 106 may provide call resource allocation and mobility management functionality including the orchestration of soft handoffs between base stations 110. The BSC 106 may also route the received data to the MSC 102, which provides additional routing services for interfacing with the PSTN 104. Similarly, the PSTN 104 may interface with the MSC 102, and the MSC 102 may interface with the BSC 106, which in turn may control the base stations 110 to transmit sets of forward link signals to sets of mobile stations 108.

Figure 2:
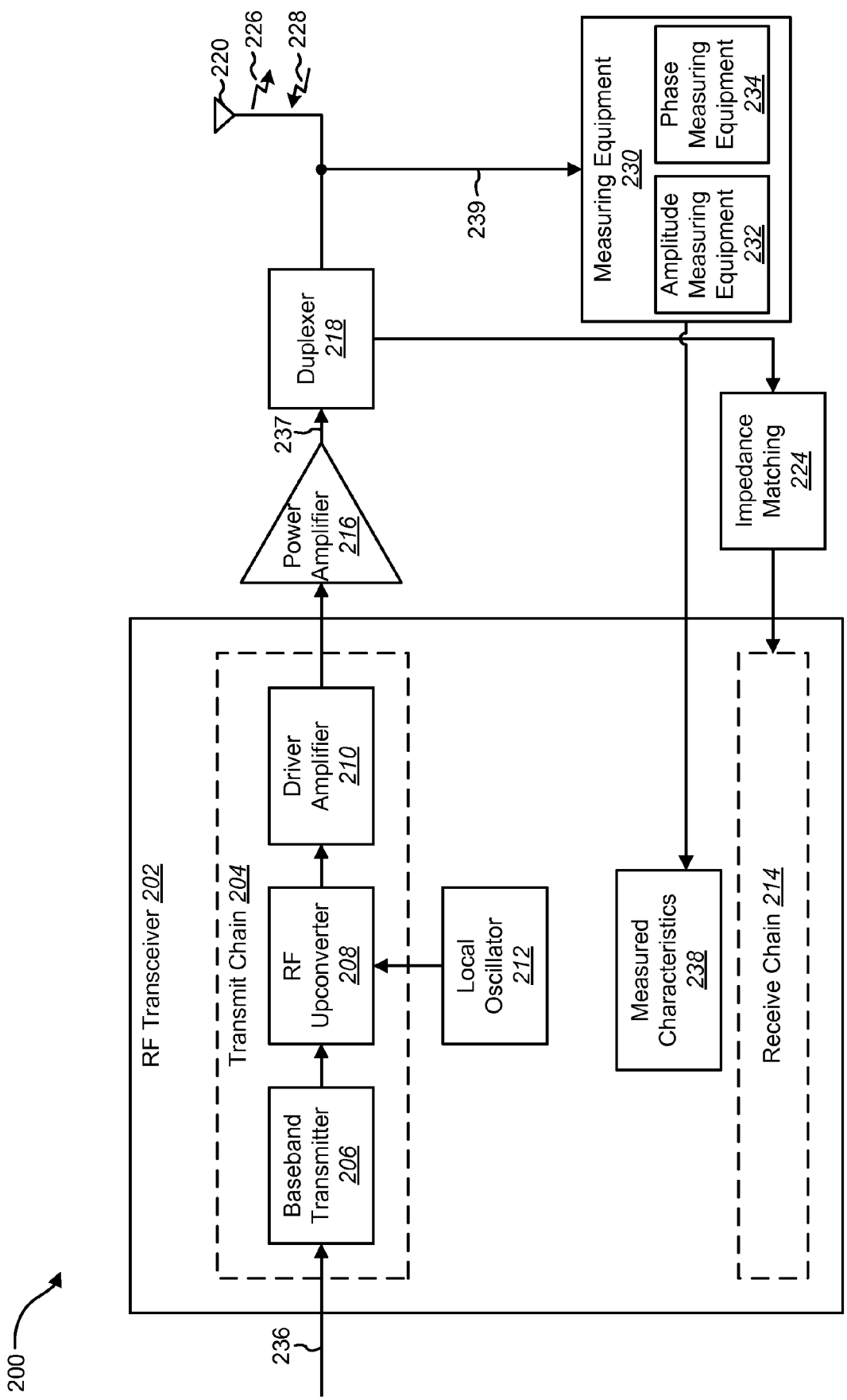
FIG. 2 is a block diagram illustrating one example of electronic components capable of transmitting.

FIG. 2 is a block diagram illustrating one example of electronic components 200 capable of transmitting. The electronic components 200 may be part of a mobile station 108, a base station 110 or any other type of device that may transmit. The electronic components 200 may include a power amplifier 216. Tests may be conducted in order to optimize the performance and efficiency of the amplifier 216. In one scenario, the tests may be conducted before the components 200 are introduced to the market (e.g., before an end user acquires the components 200). In one example, the configuration 200 may include a radio frequency (RF) transceiver 202. The transceiver 202 may transmit outgoing signals 226 and receive incoming signals 228 signals via an antenna 220. A transmit chain 204 may be used to process signals that are to be transmitted and a receive chain 214 may be implemented to process signals received by the transceiver 202. An incoming signal 228 may be processed by a duplexer 218 and impedance matching 224 of the incoming signal 228 may occur. The incoming signal 228 may then be processed by the receive chain 214.

In one configuration, the system 200 is tested in order to calibrate the PA 216 and optimize the efficiency of the PA 216. A testing input signal 236 may be provided to a baseband transmitter 206. The baseband transmitter 206 may be a part of the transmit chain 204. The baseband transmitter 206 may also include a filter (not shown) to filter out noise associated with the testing input signal 236. The testing input signal 236 may be up-converted into a high frequency signal by an RF up-converter 208. The up-converter 208 may be under the control of a local oscillator 212. A driver amplifier 210 may amplify the signal and the signal may pass through the PA 216.

Figure 10:
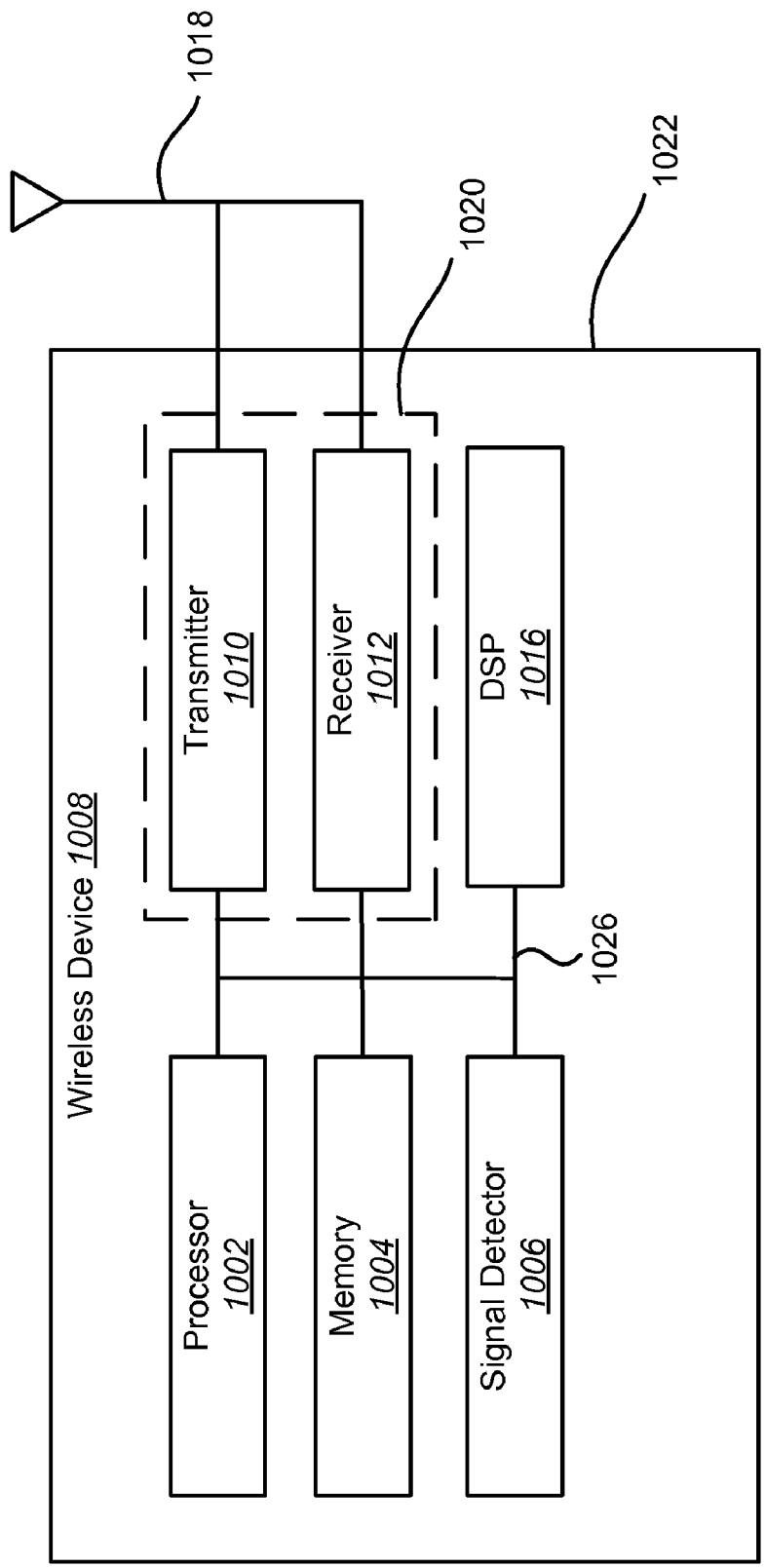
FIG. 10 illustrates various components that may be utilized in a wireless device.
Figure 11:
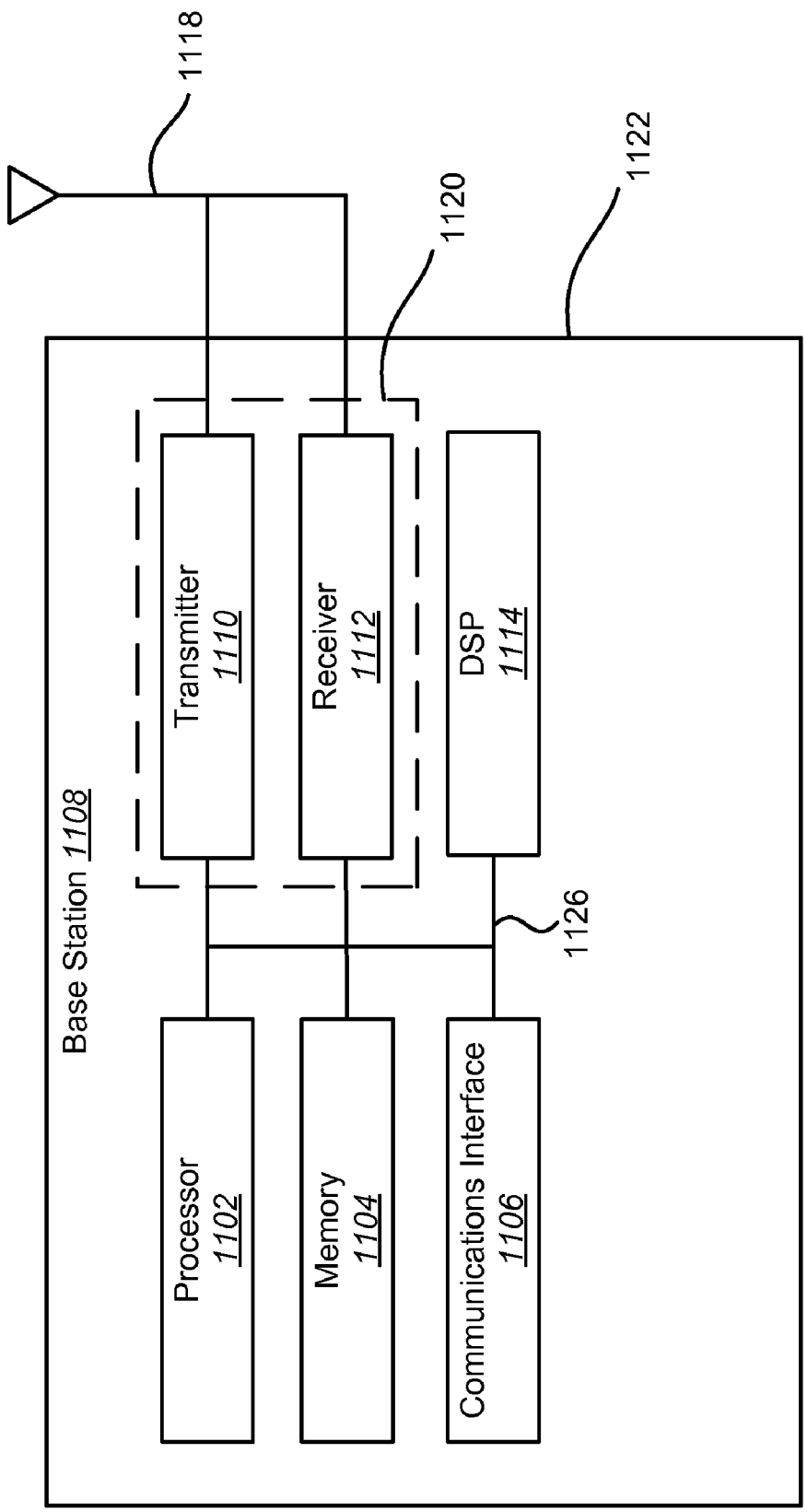
FIG. 11 is a block diagram of a base station in accordance with one example of the disclosed systems and methods.

In one configuration, the testing input signal 236 may be fed through the transmit chain 204, into the PA 216, and the PA output 237 may be passed through a duplexer 218. The duplexed signal 239 may be measured (rather than measuring the output signal 226 from the antenna 220). During the testing of the PA 216, measuring equipment 230 may be connected to the output of the duplexer 218 (i.e., the duplexed signal 239). The equipment 230 may include amplitude measuring equipment or functionality 232 and phase measuring equipment or functionality 234. The measuring equipment 230 may be implemented by a computing device that includes a processor, memory, a display, communication interfaces, and the like. The block diagrams of FIGS. 10 and 11 illustrate these components in the context of a wireless device and a base station.

The measuring equipment 230 may implement the amplitude measuring functionality and the phase measuring functionality to measure the mean AMAM/AMPM characteristics of the PA output 237 after it has passed through the duplexer 218 (i.e., the duplexed signal 239). The measured characteristics 238 (e.g., mean AMAM/AMPM characteristics) may be used to implement pre-distortion techniques in the baseband transmitter 206 when the system 200 is in normal use (see FIG. 9). For example, if the components 200 were part of a mobile station 108, the pre-distortion techniques may be used in the baseband transmitter 206 during normal operation of the mobile station 108.

Figure 3:
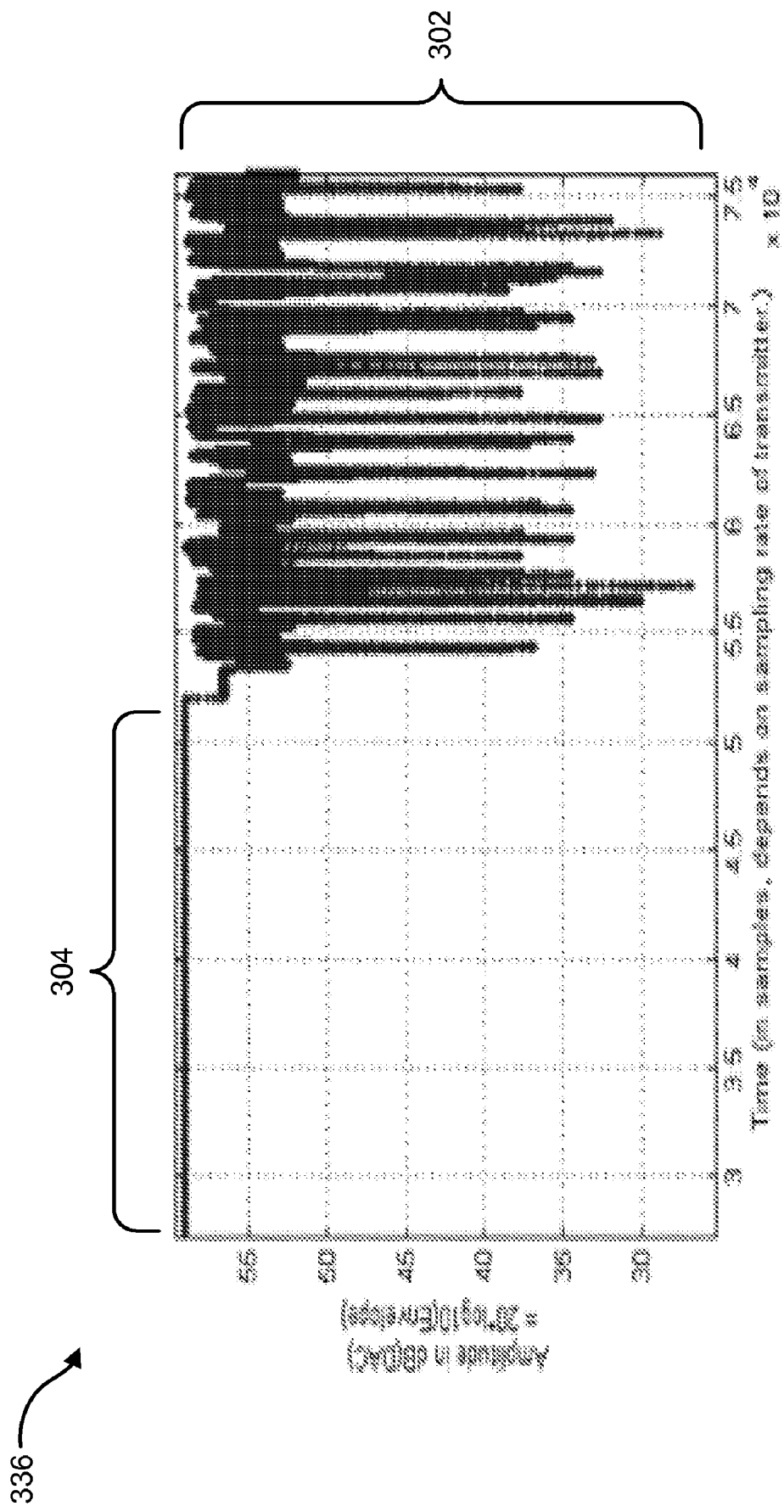
FIG. 3 is one configuration illustrating amplitude waveform of a testing input signal.

FIG. 3 illustrates one example of the amplitude representation 302 of a testing input signal 336. The signal 336 may be used to calibrate the PA 216. The amplitude waveform 302 of the testing signal 336 may be created so that it 336 has similar characteristics to transmit signals that may be transmitted in various communication systems such as EDGE, WCDMA, CDMA, GSM, etc. The amplitude waveform 302 of the signal 336 may be obtained by subtracting a constant value from each sample of the transmit signal. In one example, subtracting a constant value from the envelope of the transmit signal increases the dynamic range of the testing input signal 336. The increase in the dynamic range may allow the AMAM/AMPM characteristics of the testing input signal 336 to be measured over a wider input range. In addition, extending the range of the signal 336 may assist in maintaining the slope characteristics of the signal 336. Maintaining the slope characteristics of the testing signal 336 may affect the PA memory so that the behavior of the PA with the testing signal 336 is similar to the behavior of the PA with the transmit signal.

In addition, to increasing the dynamic range of the testing signal 336, a flat step 304 may be added prior to the amplitude waveform 302. The flat step 304 may trigger the measuring equipment 230 to measure the AMAM/AMPM characteristics of the signal 336. The flat step 304 may also be used to measure the frequency error between the system 200 and a receiving apparatus (not shown). The implementation of the flat step 304 may also correct the measured frequency error.

Figure 4:
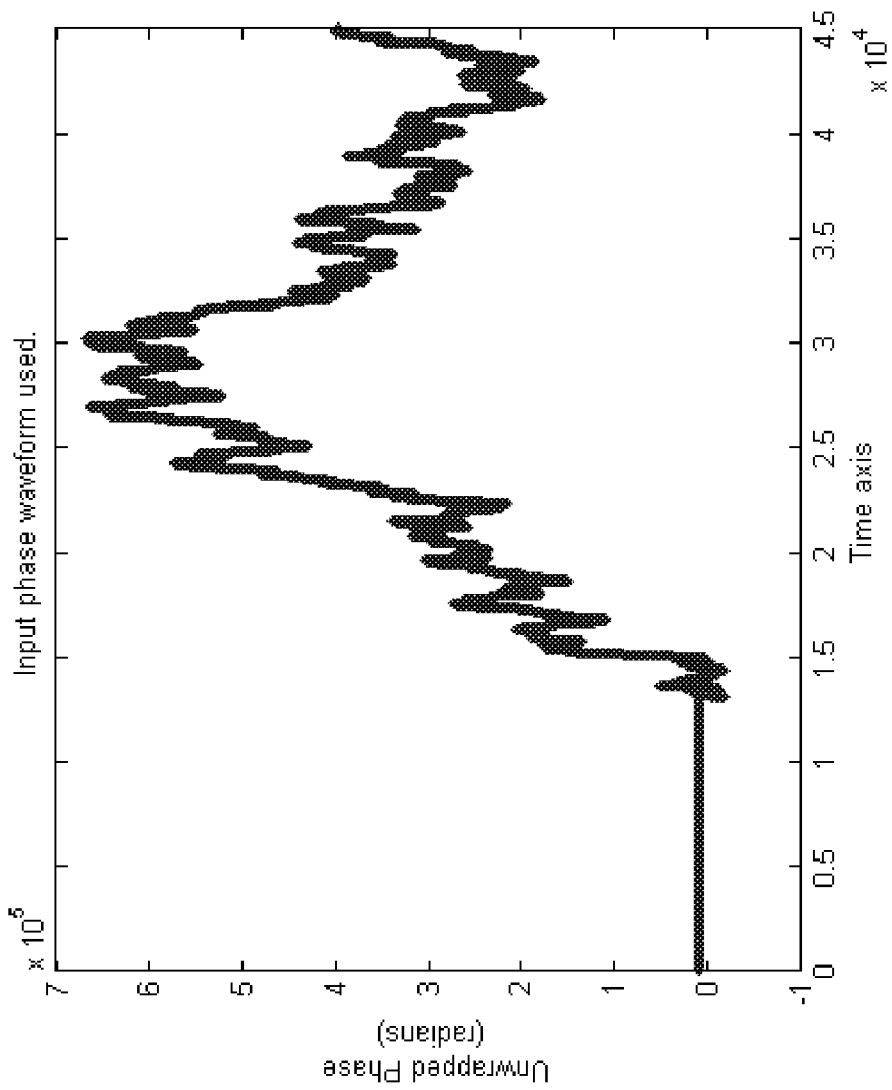
FIG. 4 is one configuration illustrating phase waveform of the testing input signal.

FIG. 4 illustrates one example of the phase of a testing input signal 436. In one configuration, the amplitude visualization of the testing input signal 436 is illustrated in FIG. 3 and the phase visualization of the testing input signal 436 is illustrated in FIG. 4.

Figure 5:
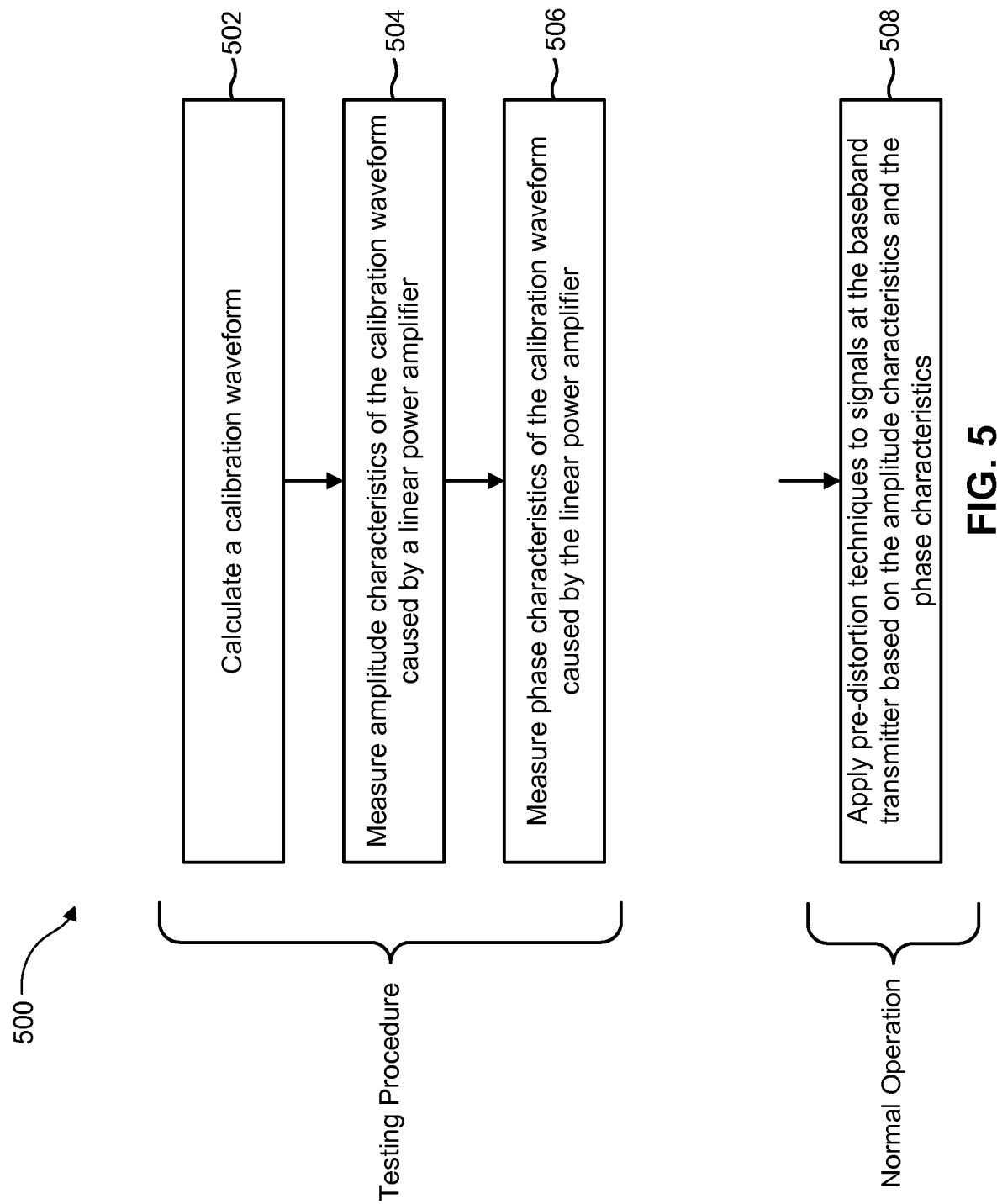
FIG. 5 is a flow diagram illustrating one configuration of a method for measuring characteristics of a waveform used to calibrate a power amplifier.

FIG. 5 is a flow diagram illustrating one configuration of a method 500 for measuring characteristics of a waveform used to calibrate a power amplifier. The method 500 may be implemented by a transmitter, such as a transmitter in a mobile station 108, base station 110, etc. In one example, a calibration waveform is calculated 502 (see FIG. 8). The calibration waveform may be the testing input signal 236 previously mentioned. Amplitude characteristics of the calibration waveform may be measured 504. The amplitude characteristics may be measured at the PA output 237 after the PA output 237 has passed through the duplexer 218. In addition, phase characteristics of the calibration waveform may be measured 506. The phase characteristics may be measured at the PA output 237 after it 237 has passed through the duplexer 218. The method thus far described may be considered a testing procedure. The testing procedure may be carried out at the factory, on an assembly line, at a testing facility, etc., before the transmitter is being used by an end-user, or a service provider, etc.

Once the transmitter has been shipped for its end use, it may enter normal operation. In one configuration, pre-distortion techniques may be applied 508 to signals as they enter the baseband transmitter 206 to compensate for the affects of the PA 216 on signals the PA 216 amplifies. The pre-distortion techniques may be based on the measured amplitude characteristics and phase characteristics acquired during the testing procedure.

Figure 6:
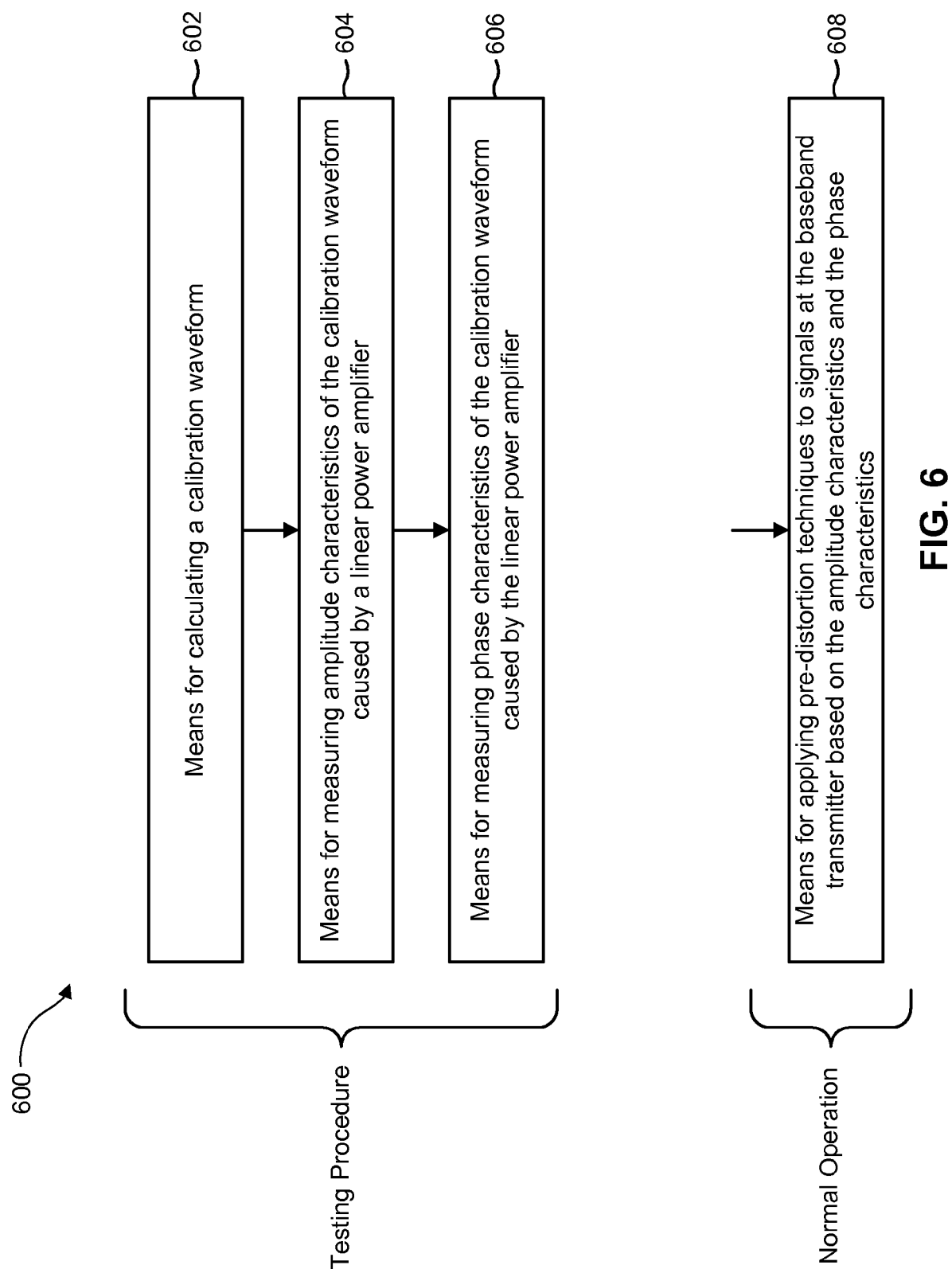
FIG. 6 illustrates means-plus-function blocks corresponding to the method of FIG. 5.

The method of FIG. 5 described above may be performed by various hardware and/or software component(s) and/or module(s) corresponding to the means-plus-function blocks illustrated in FIG. 6. In other words, blocks 502 through 508 illustrated in FIG. 5 correspond to means-plus-function blocks 602 through 608 illustrated in FIG. 6.

Figure 7:
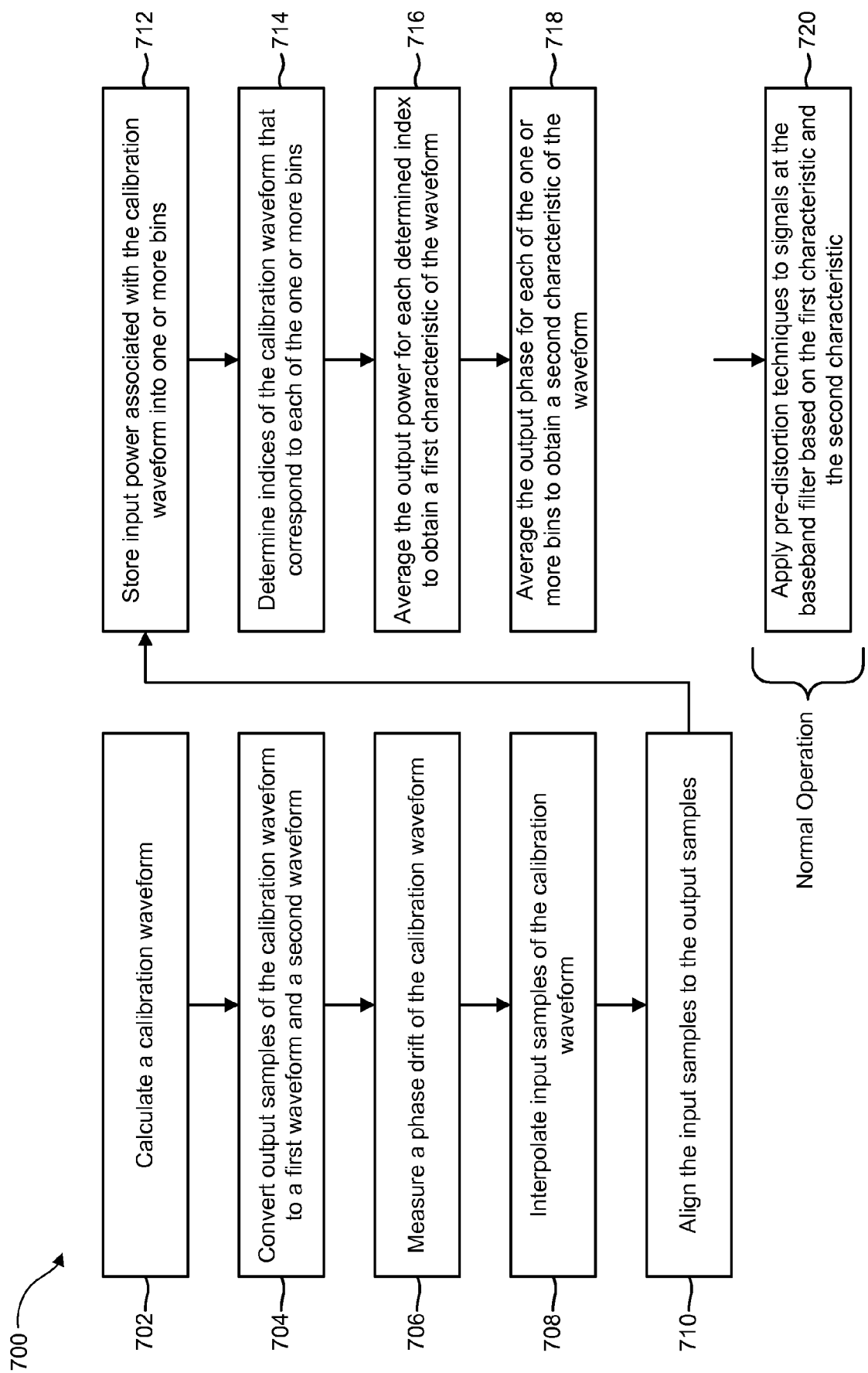
FIG. 7 is a flow diagram illustrating one configuration of a method for measuring amplitude modulation to amplitude modulation (AMAM) and amplitude modulation to phase modulation (AMPM) characteristics of a waveform produced by a power amplifier.

FIG. 7 is a flow diagram illustrating one configuration of a method 700 for measuring AMAM/AMPM characteristics of a PA. Portions of the method 700 may be implemented during a testing procedure of a transmitter. Other portions of the method 700 may be implemented during normal operation of the transmitter.

In one configuration, some of the method 700 may be implemented by the measuring equipment 230. In one example, a calibration waveform (i.e., a testing input signal 236) is calculated. Output samples of the calibration waveform may be converted 704 to a first waveform and a second waveform. For example, in-phase (I) and quadrature (Q) samples may be captured and converted 704 to an envelope waveform and a phase waveform.

In one configuration, a phase drift of the calibration waveform may be measured 706. Linear regression may be implemented to measure 706 the phase drift. In addition, linear regression may be used to measure the frequency error associated with a flat step portion of the calibration waveform. An example of the flat step portion 304 is illustrated in FIG. 3. A frequency error correction technique, based on the measured frequency error, may be applied to the calibration waveform. Input samples of the calibration waveform may be interpolated 708 in order to obtain samples at the same sampling rate as the measuring equipment 230. In another configuration, the sampling rate used by the transmitter may be used.

The input samples may be aligned 710 to the output samples. For example, the input samples may be correlated with the output samples. The input and output samples may be aligned at the point of maximum correlation. In one example, input power associated with the calibration waveform may be stored 712 into one or more bins. An example bin size may be $1\frac{1}{10}^{th}$ of a decibel (dB).

Indices of the calibration waveform that correspond to each of the one or more bins may be determined 714. The output power for each determined index may be averaged 716 in order to obtain a first characteristic of the calibration waveform. For example, Index (Ind)=find(Pin). The input power (Pin) may be in the current bin value. The output power (Pout) may be calculated as Pout (current bin)=mean (Pin(Ind)). The first characteristic may be the AMAM characteristic. In one example, the output phase for each of the one or more bins is averaged 718 in order to obtain a second characteristic of the waveform. The second characteristic may be the AMPM characteristic. The method thus far described may be considered a testing procedure as previously explained.

In one example, during normal operation of the transmitter, pre-distortion techniques may be applied 720 to signals at the baseband filter 206. The pre-distortion techniques may be based on the determined first characteristic and the second characteristic.

Figure 8:
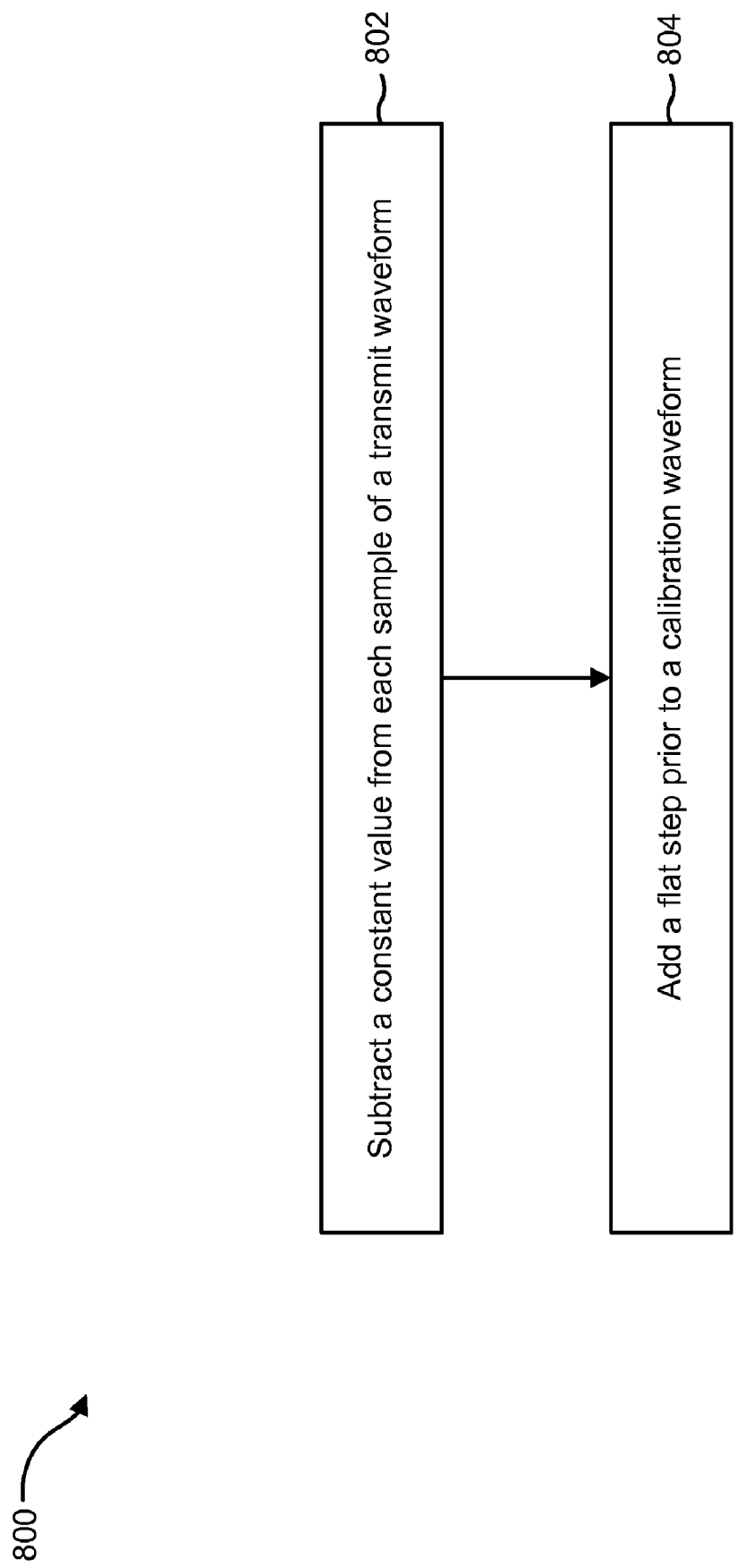
FIG. 8 is a flow diagram illustrating one example of a method for obtaining a calibration waveform.

FIG. 8 is a flow diagram illustrating one example of a method 800 for obtaining a calibration waveform (i.e., a testing input signal 236). The method 800 may be implemented during a testing procedure. As previously mentioned, a constant value may be subtracted from each sample of a transmit waveform. Subtracting a constant value from the envelope of the transmit waveform may increase the dynamic range of the calibration waveform. The increase in the dynamic range may allow the AMAM/AMPM characteristics of the calibration waveform to be measured over a wider input range. In order to extend the dynamic range of the envelope of the calibration waveform by x dB, the following formulas may be used. E=envelope of the transmit waveform. x=dB extension desired.

$$k = 10^{(x/20)} \frac{\max(E)}{\min(E)}.$$

y=ceiling(max(E)/(1−k)−k*(min(E)/(1−k)).  Calibration waveform envelope=(E−y).

In one configuration, a flat step is added 804 prior to the calibration waveform. An example of the flat step 304 is illustrated in FIG. 3. The flat step may trigger the measuring equipment 230. In addition, the flat step may be used to measure the frequency error between the system 200 and a receiving device. The frequency error may be corrected during the duration of the flat step 304.

Figure 9:
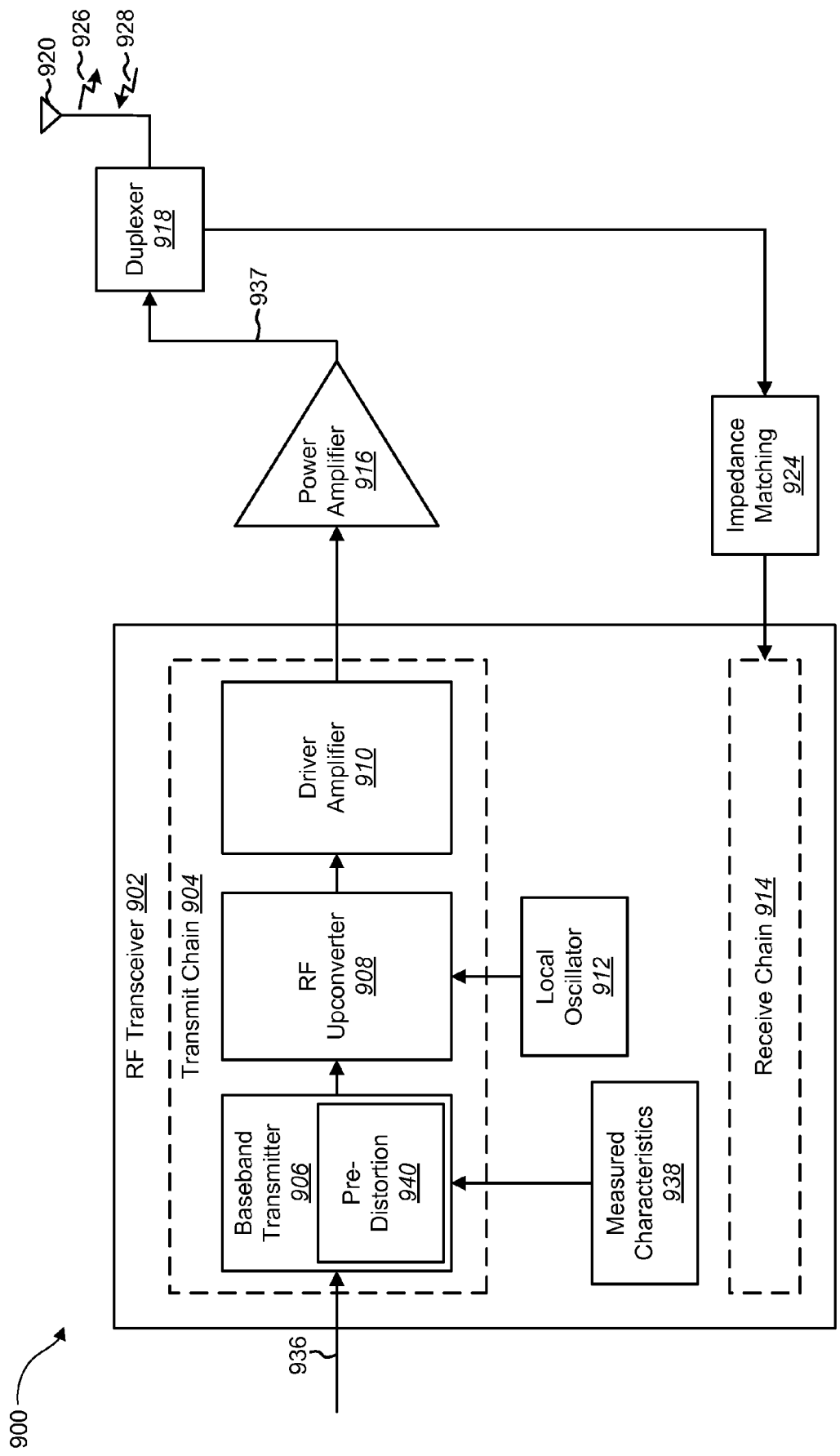
FIG. 9 is a block diagram illustrating one example of a system capable of transmitting after a test period to calibrate a power amplifier has occurred.

FIG. 9 is a block diagram illustrating one example of a transmitting system 900 during normal operation. The system 900 may include an RF transceiver 902 for transmitting outgoing signals 926 and receiving incoming signals 928 via an antenna 920. The RF transceiver 902 includes a receive chain 914 that receives the incoming signals 928. For example, the incoming signals 928 may be received via the antenna 920 and processed by a duplexer 918. An impedance matching module 924 may match the impedance of the incoming signals 928. The receive chain 914 may further process the incoming signals 928.

A transmit signal 936 may be processed by the transmit chain 904 before being transmitted as an outgoing signal 926. The transmit signal may be input to a baseband transmitter 906, which is part of the transmit chain 904. Pre-distortion techniques may be applied to the transmit signal 936 at the baseband transmitter 906. The pre-distortion techniques may add a certain quantity of pre-distortion to the transmit signal 936. The pre-distortion may cancel or otherwise compensate for distortion that is added to the signal at a PA 916. The pre-distortion techniques may be determined based on the measured AMAM/AMPM characteristics that were measured during a testing procedure of a transmitter in the system 900.

After the signal is processed by the baseband transmitter 906, it may be up-converted to a higher frequency signal by an RF up-converter 908. The up-converter 908 may be controlled by a local oscillator 912. A driver amplifier 910 may amplify the up-converted signal. In addition, the PA 916 may further amplify the signal. Amplification of the signal by the PA 916 may distort the signal. The pre-distortion previously applied to the signal may cancel or otherwise compensate for the distortion added at the PA 916. An amplified signal 937 may be processed by the duplexer 918 and transmitted as a transmit signal 926 to a receiving device via the antenna 920.

FIG. 10 illustrates various components that may be utilized in a wireless device 1008. The wireless device 1008 is an example of a device that may be used with the various systems and methods described herein. The wireless device 1008 may be a mobile station 108, a mobile telecommunications device, cellular telephone, handset, personal digital assistant (PDA), etc.

The wireless device 1008 may include a processor 1002 which controls operation of the wireless device 1008. The processor 1002 may also be referred to as a central processing unit (CPU). Memory 1004, which may include both read-only memory (ROM) and random access memory (RAM), provides instructions and data to the processor 1002. A portion of the memory 1004 may also include non-volatile random access memory (NVRAM). The processor 1002 typically performs logical and arithmetic operations based on program instructions stored within the memory 1004. The instructions in the memory 1004 may be executable to implement the methods described herein.

The wireless device 1008 may also include a housing 1022 that may include a transmitter 1010 and a receiver 1012 to allow transmission and reception of data between the wireless device 1008 and a remote location. The transmitter 1010 and receiver 1012 may be combined into a transceiver 1020. An antenna 1018 may be attached to the housing 1022 and electrically coupled to the transceiver 1020. The wireless device 1008 may also include (not shown) multiple transmitters, multiple receivers, multiple transceivers and/or multiple antenna.

The wireless device 1008 may also include a signal detector 1006 that may be used to detect and quantify the level of signals received by the transceiver 1020. The signal detector 1006 may detect such signals as total energy, pilot energy per pseudonoise (PN) chips, power spectral density, and other signals. The wireless device 1008 may also include a digital signal processor (DSP) 1016 for use in processing signals.

The various components of the wireless device 1008 may be coupled together by a bus system 1026 which may include a power bus, a control signal bus, and a status signal bus in addition to a data bus. However, for the sake of clarity, the various busses are illustrated in FIG. 10 as the bus system 1026.

FIG. 11 is a block diagram of a base station 1108 in accordance with one example of the disclosed systems and methods. The base station 1108 is an example of a device that may be used with the various systems and methods described herein. Examples of different implementations of a base station 1108 include, but are not limited to, an evolved NodeB (eNB), a base station controller, a base station transceiver, an access router, etc. The base station 1108 includes a transceiver 1120 that includes a transmitter 1110 and a receiver 1112. The transceiver 1120 may be coupled to an antenna 1118. The base station 1108 further includes a digital signal processor (DSP) 1114, a general purpose processor 1102, memory 1104, and a communications interface 1106. The various components of the base station 1108 may be included within a housing 1122.

The processor 1102 may control operation of the base station 1108. The processor 1102 may also be referred to as a CPU. The memory 1104, which may include both read-only memory (ROM) and random access memory (RAM), provides instructions and data to the processor 1102. A portion of the memory 1104 may also include non-volatile random access memory (NVRAM). The memory 1104 may include any electronic component capable of storing electronic information, and may be embodied as ROM, RAM, magnetic disk storage media, optical storage media, flash memory, on-board memory included with the processor 1102, EPROM memory, EEPROM memory, registers, a hard disk, a removable disk, a CD-ROM, etc. The memory 1104 may store program instructions and other types of data. The program instructions may be executed by the processor 1102 to implement some or all of the methods disclosed herein.

In accordance with the disclosed systems and methods, the antenna 1118 may receive reverse link signals that have been transmitted from a nearby wireless device 1008. The antenna 1118 provides these received signals to the transceiver 1120 which filters and amplifies the signals. The signals are provided from the transceiver 1120 to the DSP 1114 and to the general purpose processor 1102 for demodulation, decoding, further filtering, etc.

The various components of the base station 1108 are coupled together by a bus system 1126 which may include a power bus, a control signal bus, and a status signal bus in addition to a data bus. However, for the sake of clarity, the various busses are illustrated in FIG. 11 as the bus system 1126.

As used herein, the term "determining" encompasses a wide variety of actions and, therefore, "determining" can include calculating, computing, processing, deriving, investigating, looking up (e.g., looking up in a table, a database or another data structure), ascertaining and the like. Also, "determining" can include receiving (e.g., receiving information), accessing (e.g., accessing data in a memory) and the like. Also, "determining" can include resolving, selecting, choosing, establishing and the like.

The phrase "based on" does not mean "based only on," unless expressly specified otherwise. In other words, the phrase "based on" describes both "based only on" and "based at least on."

The various illustrative logical blocks, modules and circuits described in connection with the present disclosure may be implemented or performed with a general purpose processor, a digital signal processor (DSP), an application specific integrated circuit (ASIC), a field programmable gate array signal (FPGA) or other programmable logic device, discrete gate or transistor logic, discrete hardware components or any combination thereof designed to perform the functions described herein. A general purpose processor may be a microprocessor, but in the alternative, the processor may be any commercially available processor, controller, microcontroller or state machine. A processor may also be implemented as a combination of computing devices, e.g., a combination of a DSP and a microprocessor, a plurality of microprocessors, one or more microprocessors in conjunction with a DSP core or any other such configuration.

The steps of a method or algorithm described in connection with the present disclosure may be embodied directly in hardware, in a software module executed by a processor or in a combination of the two. A software module may reside in any form of storage medium that is known in the art. Some examples of storage media that may be used include RAM memory, flash memory, ROM memory, EPROM memory, EEPROM memory, registers, a hard disk, a removable disk, a CD-ROM and so forth. A software module may comprise a single instruction, or many instructions, and may be distributed over several different code segments, among different programs and across multiple storage media. A storage medium may be coupled to a processor such that the processor can read information from, and write information to, the storage medium. In the alternative, the storage medium may be integral to the processor.

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

The functions described may be implemented in hardware, software, firmware, or any combination thereof. If implemented in software, the functions may be stored as one or more instructions on a computer-readable medium. A computer-readable medium may be any available medium that can be accessed by a computer. By way of example, and not limitation, a computer-readable medium may comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Disk and disc, as used herein, includes compact disc (CD), laser disc, optical disc, digital versatile disc (DVD), floppy disk and Blu-ray® disc where disks usually reproduce data magnetically, while discs reproduce data optically with lasers.

Software or instructions may also be transmitted over a transmission medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of transmission medium.

Further, it should be appreciated that modules and/or other appropriate means for performing the methods and techniques described herein, such as those illustrated by FIGS. 5-8, can be downloaded and/or otherwise obtained by a mobile device and/or base station as applicable. For example, such a device can be coupled to a server to facilitate the transfer of means for performing the methods described herein. Alternatively, various methods described herein can be provided via a storage means (e.g., random access memory (RAM), read only memory (ROM), a physical storage medium such as a compact disc (CD) or floppy disk, etc.), such that a mobile device and/or base station can obtain the various methods upon coupling or providing the storage means to the device. Moreover, any other suitable technique for providing the methods and techniques described herein to a device can be utilized.

It is to be understood that the claims are not limited to the precise configuration and components illustrated above. Various modifications, changes and variations may be made in the arrangement, operation and details of the systems, methods, and apparatus described herein without departing from the scope of the claims.

What is claimed is:

1. A method for measuring non-linear characteristics of a power amplifier, comprising:
  calculating a calibration waveform during a testing procedure period, wherein calculating comprises subtracting a constant value from each sample of a transmit waveform;

measuring amplitude characteristics of the calibration waveform at the output of the power amplifier during the testing procedure period;

measuring phase characteristics of the calibration waveform at the output of the power amplifier during the testing procedure period; and configuring pre-distortion techniques based on the amplitude characteristics and the phase characteristics to be used during a normal operation period.

2. The method of claim 1, wherein calculating the calibration waveform further comprises adding a flat step portion prior to the calibration waveform.

3. The method of claim 1, further comprising converting output samples of the calibration waveform to an envelope waveform and a phase waveform.

4. The method of claim 1, further comprising measuring a phase drift of the calibration waveform.

5. The method of claim 1, further comprising interpolating input samples of the calibration waveform.

6. The method of claim 1, further comprising aligning input samples to output samples.

7. The method of claim 1, further comprising storing input power associated with the calibration waveform into one or more bins.

8. The method of claim 7, further comprising determining indices of the calibration waveform that correspond to each of the one or more bins.

9. The method of claim 8, further comprising averaging the output power for each determined index to obtain an amplitude modulation to amplitude modulation (AMAM) characteristic.

10. The method of claim 8, further comprising averaging the output phase for each of the one or more bins to obtain an amplitude modulation to phase modulation (AMPM) characteristic.

11. An apparatus for measuring non-linear characteristics of a power amplifier, comprising:

a processor;

memory in electronic communication with the processor;

instructions stored in the memory, the instructions being executable to:

calculate a calibration waveform during a testing procedure period, wherein the instructions executable to calculate comprise instructions executable to substract a constant value from each sample of a transmit waveform;

measure amplitude characteristics of the calibration waveform at the output of the power amplifier during the testing procedure period;

measure phase characteristics of the calibration waveform at the output of the power amplifier during the testing procedure period; and configure pre-distortion techniques based on the amplitude characteristics and the phase characteristics to be used during a normal operation period.

12. The apparatus of claim 11, wherein the instructions are further executable to add a flat step portion prior to the calibration waveform.

13. The apparatus of claim 11, wherein the instructions are further executable to convert output samples of the calibration waveform to an envelope waveform and a phase waveform.

14. The apparatus of claim 11, wherein the instructions are further executable to measure a phase drift of the calibration waveform.

15. The apparatus of claim 11, wherein the instructions are further executable to interpolate input samples of the calibration waveform.

16. The apparatus of claim 11, wherein the instructions are further executable to align input samples to output samples.

17. The apparatus of claim 11, wherein the instructions are further executable to store input power associated with the calibration waveform into one or more bins.

18. The apparatus of claim 17, wherein the instructions are further executable to determine indices of the calibration waveform that correspond to each of the one or more bins.

19. The apparatus of claim 18, wherein the instructions are further executable to average the output power for each determined index to obtain an amplitude modulation to amplitude modulation (AMAM) characteristic.

20. The apparatus of claim 18, wherein the instructions are further executable to average the output phase for each of the one or more bins to obtain an amplitude modulation to phase modulation (AMPM) characteristic.

21. The apparatus of claim 11, wherein the pre-distortion techniques are configured to be used during the normal operation period of a handset.

22. The apparatus of claim 11, wherein the pre-distortion techniques are configured to be used during the normal operation period of a base station.

23. An apparatus for measuring non-linear characteristics of a power amplifier, comprising:

means for calculating a calibration waveform during a testing procedure period, wherein the means for calculating comprises means for subtracting a constant value from each sample of a transmit waveform;

means for measuring amplitude characteristics of the calibration waveform at the output of the power amplifier during the testing procedure period;

means for measuring phase characteristics of the calibration waveform at the output of the power amplifier during the testing procedure period; and means for configuring pre-distortion techniques based on the amplitude characteristics and the phase characteristics to be used during a normal operation period.

24. The apparatus of claim 23, wherein the means for calculating further comprises means for adding a flat step portion prior to the calibration waveform.

25. A non-transitory computer-program product for measuring non-linear characteristics of a power amplifier, the computer-program product comprising a computer-readable medium having instructions thereon, the instructions comprising:

code for calculating a calibration waveform during a testing procedure period, wherein the means for calculating comprises means for subtracting a constant value from each sample of a transmit waveform;

code for measuring amplitude characteristics of the calibration waveform at the output of the power amplifier during the testing procedure period;

code for measuring phase characteristics of the calibration waveform at the output of the power amplifier during the testing procedure period; and code for configuring pre-distortion techniques based on the amplitude characteristics and the phase characteristics to be used during a normal operation period.

26. The non-transitory computer-readable medium of claim 25, wherein the code for calculating further comprises code for adding a flat step portion prior to the calibration waveform.

* * * * *